United States Patent [19]
Abdi

[11] Patent Number: 5,155,386
[45] Date of Patent: Oct. 13, 1992

[54] PROGRAMMABLE HYSTERESIS COMPARATOR

[75] Inventor: Behrooz Abdi, Chandler, Ariz.

[73] Assignee: Motorola, Inc., Schaumburg, Ill.

[21] Appl. No.: 709,472

[22] Filed: Jun. 3, 1991

[51] Int. Cl.5 .................... H03K 5/153; H03K 5/24
[52] U.S. Cl. .................... 307/355; 307/359; 307/360
[58] Field of Search .............. 307/350, 355, 354, 359, 307/360; 328/146, 147, 150

[56] References Cited

U.S. PATENT DOCUMENTS

| | | | |
|---|---|---|---|
| 4,581,545 | 4/1986 | Beale et al. | 307/359 |
| 4,873,702 | 10/1989 | Chiu | 307/359 |
| 4,926,068 | 5/1990 | Fujita | 307/359 |
| 5,039,888 | 8/1991 | Bell et al. | 307/359 |

*Primary Examiner*—John Zazworsky
*Attorney, Agent, or Firm*—Bradley J. Botsch

[57] ABSTRACT

A comparator having programmable hysteresis is provided. The signal supplied to an inverting input of the comparator (18) is determined by the logic state of the output of comparator and is a programmable factor of one of two predetermined signals ($V_{REF1}$ or $V_{REF2}$). The programmable factor is determined by the logic states of a plurality of control signals and can be adjusted by varying the logic states of the plurality of control signals.

3 Claims, 2 Drawing Sheets

PROGRAMMABLE HYSTERESIS COMPARATOR

BACKGROUND OF THE INVENTION

This invention relates to circuits, for example, a programmable hysteresis comparator circuit.

A typical comparator has first and second inputs for providing an output logic signal. The comparator functions such that if a first signal applied at the first input is greater than a second signal applied at the second input, then the output signal of the comparator is in a first logic state. On the other hand, if the first signal is less than the second signal, then the output signal of the comparator is in a second logic state.

Hystersis is often included in a comparator so as to allow the threshold signal level that determines when the comparator switches from a first logic state to a second logic state to be different the threshold signal level that determines when the comparator switches from a second logic state to a first logic state. As a result, hysteresis typically prevents the output of the comparator from switching logic states for small predetermined perturbations occurring on the first or second signals.

However, most, if not all, comparators do not allow for independent programmability for the high and low hysteresis threshold levels. Further, most, if not all, comparators are not fully differential such that even the hysteresis threshold levels as well as the input and output signals of the comparator are differential.

Hence, there exists a need for a differential comparator having a plurality of programmable hysteresis threshold levels.

SUMMARY OF THE INVENTION

Briefly, there is provided a circuit comprising a first circuit responsive to a control signal for alternately providing first and second reference signals at an output; a second circuit responsive to a signal appearing at the output of the first circuit for providing an output signal, the output signal of the second circuit being a predetermined factor of the signal appearing at the output of the first circuit; and a comparator having first and second inputs and an output, the first input of the comparator being coupled to receive an input signal, the second input of the comparator being coupled to receive the output signal of the second means, the output of the comparator providing the control signal to the first circuit, the output of the comparator being coupled to an output of the circuit.

The present invention will be better understood from the following detailed description taken in conjunction with the accompanying drawings.

DETAILED DESCRIPTION OF THE DRAWINGS

Figure 1:
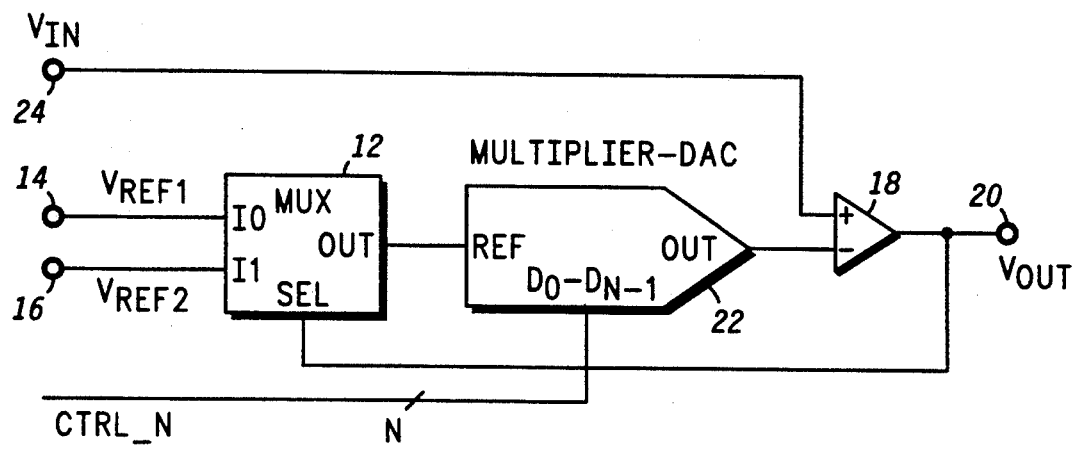
FIG. 1 is a block diagram illustrating a programmable hysteresis comparator in accordance with the present invention.

Referring to FIG. 1, a block diagram illustrating programmable hysteresis comparator 10 is shown comprising multiplexer 12 having a first input coupled to input terminal 14 at which reference voltage $V_{REF1}$ is applied. A second input of multiplexer 12 is coupled to input terminal 16 at which reference voltage $V_{REF2}$ is applied. The select input of multiplexer 12 is coupled to the output of comparator 18 whereby the output of comparator 18 provides signal $V_{OUT}$ at output terminal 20. The output of multiplexer 12 is coupled to the reference input of multiplier digital-to-analog converter 22 (simply referred to as MDAC from hereon). MDAC 22 has an output coupled to an inverting input of comparator 18. MDAC 22 has a plurality of control inputs, for example, 5, for respectively receiving a plurality of control signals denoted by CTRL_N. The non-inverting input of comparator 18 is coupled to input terminal 24 at which input voltage $V_{IN}$ is applied.

Briefly, the voltage level supplied to the inverting input of comparator 18 is determined by the voltage logic level of the output of comparator 18 and is one of two predetermined voltage levels. The two predetermined voltage levels are a programmable factor of reference voltages $V_{REF1}$ and $V_{REF2}$ wherein the programmable factor is set by the logic states of the plurality of control signals supplied to MDAC 22.

In particular, assume that voltage $V_{OUT}$ is in a logic low state thereby passing the signal occurring at the first input of multiplexer 12 to the output of multiplexer 12. In other words, reference voltage $V_{REF1}$ appears at the output of multiplexer 12 and, subsequently, to the reference input of MDAC 22.

MDAC 22 subsequently provides an output which is substantially equal to the voltage appearing at its reference input multiplied by a constant K factor. Thus, the voltage applied at the inverting input of comparator 18 is substantially equal to: $(K \times V_{REF1})$.

It is understood that the multiplier factor K due to MDAC 22 is programmable via the plurality of control signals CTRL_N which are supplied to control inputs $D_0-D_{N-1}$ of MDAC 22.

As voltage $V_{IN}$ rises above the voltage applied at the inverting input of comparator 18 $(K \times V_{REF1})$, the output comparator 18 switches from a logic low voltage level to a logic high voltage level thereby forcing multiplexer 12 to pass the signal occurring at its second input to its output. In other words, reference voltage $V_{REF2}$ appears at the output of multiplexer 12 and, subsequently, to the reference input of MDAC 22.

Likewise, MDAC 22 subsequently provides an output which is substantially equal to the voltage appearing at its reference input multiplied by a constant K factor. Thus, the voltage applied at the inverting input of comparator 18 is now substantially equal to: $(K \times V_{REF2})$.

Subsequently, when voltage $V_{IN}$ falls below the voltage applied at the inverting input of comparator 18 $(K \times V_{REF2})$, the output of comparator 18 switches from a logic high voltage level to a logic low voltage level thereby re-setting the voltage level appearing at the inverting input of comparator 18 back to $(K \times V_{REF1})$ and the operation continues as aforedescribed.

Figure 2:
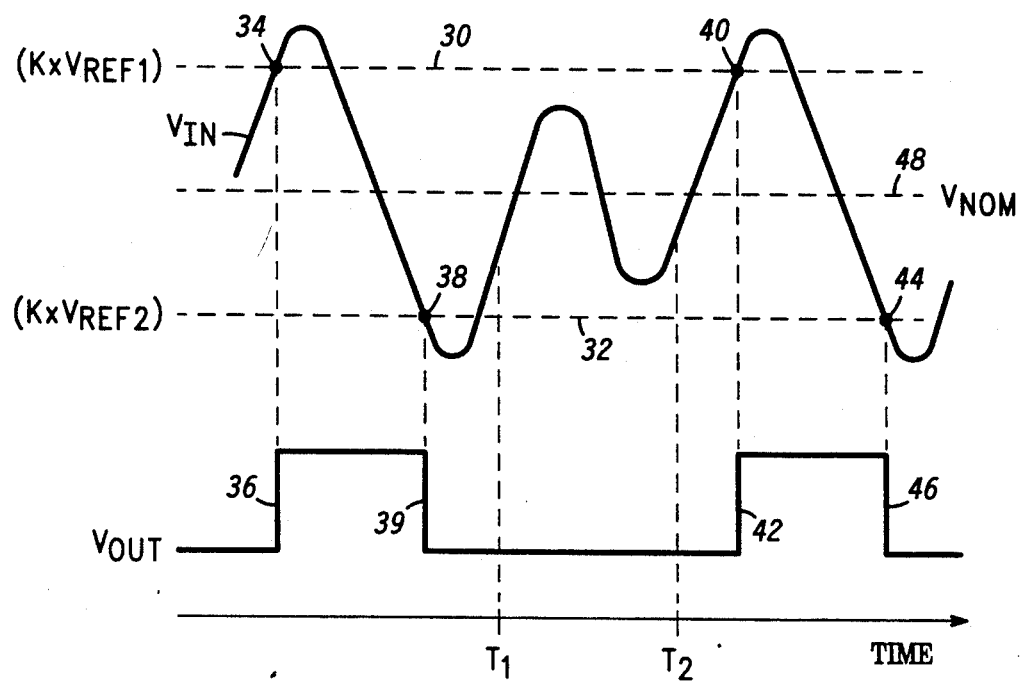
FIG. 2 graphically illustrates an output signal of the programmable hysteresis comparator of FIG. 1 for a given input signal.

Referring to FIG. 2, a graphical illustration of output signal $V_{OUT}$ of programmable hysteresis comparator 10 of FIG. 1 is shown for a given input signal $V_{IN}$ as a function of time. Hysteresis threshold voltage levels 30 and 32 are shown whereby voltage level 30 corresponds to the voltage level ($K \times V_{REF1}$), while voltage level 32 corresponds to the voltage level ($K \times V_{REF2}$). Note that it is assumed that reference voltage $V_{REF1}$ is greater than reference voltage $V_{REF2}$.

When input voltage $V_{IN}$ is increasing and crosses voltage level 30 as denoted by point 34, output voltage $V_{OUT}$ switches from a logic low voltage level to a logic level as denoted by transition 36. As a result, when voltage $V_{OUT}$ switches to the logic high voltage level, programmable hysteresis comparator 10 responds to provide voltage level ($K \times V_{REF2}$) at the inverting input of comparator 18, as aforedescribed.

Subsequently, when input voltage $V_{IN}$ is decreasing and crosses voltage level 32 as denoted by point 38, output voltage $V_{OUT}$ switches from a logic high voltage level to a logic low voltage level as denoted by transition 39. Similarly, when voltage $V_{OUT}$ switches to the logic low voltage level, programmable hysteresis comparator 10 responds to provide voltage level ($K \times V_{REF1}$) at the inverting input of comparator 18 as aforedescribed.

As a result, comparator 18 does not switch logic states until voltage $V_{IN}$ is increasing and crosses voltage level 30 at point 40 wherein voltage $V_{OUT}$ switches from a logic low voltage level to a logic high voltage level as denoted by transition 42.

Further, when voltage $V_{IN}$ is decreasing and falls below voltage level 32 as denoted by point 44, voltage $V_{OUT}$ switches from a logic high voltage level to a logic low voltage level as denoted by transition 46.

It is worth noting that if $V_{REF1} = -(V_{REF2})$, and factor K is substantially equal to zero, voltage levels 30 and 32 will converge and become substantially equal to voltage level 48 as denoted by $V_{NOM}$.

From FIG. 2, it should be clear that due to the programmable hysteresis threshold levels 30 and 32, the perturbations of signal $V_{IN}$ during time interval ($T_1 - T_2$) did not cause a change in the signal $V_{OUT}$. Further, by adjusting the value of K, voltage levels 30 and 32 can correspondingly be adjusted to vary the amount of hysteresis of comparator 10.

Figure 3:
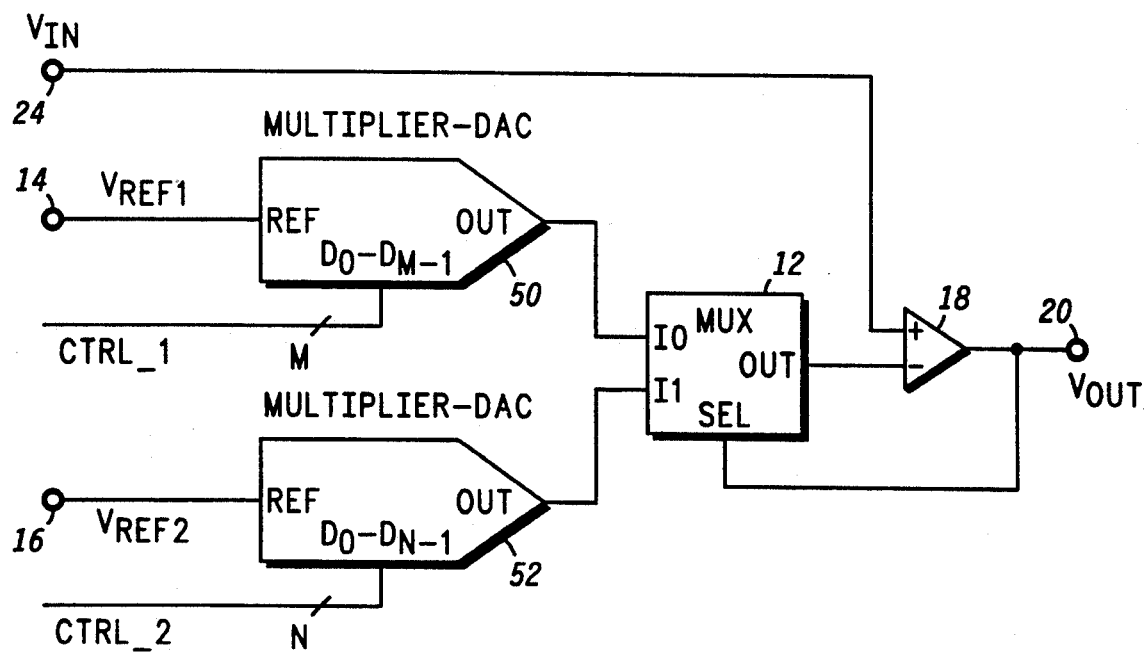
FIG. 3 is a block diagram illustrating an alternate embodiment of a programmable hysteresis comparator in accordance with the present invention.

Referring to FIG. 3, a block diagram illustrating an alternate embodiment of a programmable hysteresis comparator is shown. It is understood that components shown in FIG. 3 which correspond to the components shown in FIG. 1 are identified by the same reference numbers. The programmable hysteresis comparator of FIG. 3 includes MDACS 50 and 52 having reference inputs respectively coupled to terminals 14 and 16. The output of DAC 50 is coupled to the first input of multiplexer 12, while the output of multiplier DAC 52 is coupled to the second input of multiplexer 12. Multiplexer 12 provides an output to the inverting input of comparator 18, while the output of comparator 18 is coupled back to the select input of multiplexer 12. MDAC 50 has a plurality of control inputs, $D_0-D_{M-1}$ for receiving M control signals, denoted by CTRL_1. Likewise, MDAC 52 has a plurality of control inputs, $D_0-D_{N-1}$ for receiving N control signals, denoted by CTRL_2.

Briefly, the programmable hysteresis circuit of FIG. 3 includes two MDACS so as to allow independent control for respectively programming the multiplier factor of MDACS 50 and 52.

In particular, the voltage applied to the first input of multiplexer 12 is: ($K_1 \times V_{REF1}$), while the voltage applied to the second input of multiplexer 12 is: ($K_2 \times V_{REF2}$). It is understood that the multiplier factor $K_1$ due to MDAC 50 is programmable via the plurality of control signals CTRL_1 which are supplied to control inputs $D_0-D_{M-1}$ of MDAC 50. Likewise, the multiplier factor $K_2$ due to MDAC 52 is programmable via the plurality of control signals CTRL_2 which are supplied to control inputs $D_0-D_{N-1}$ of MDAC 52.

As a result, the voltage level appearing at the inverting input of comparator 18 is determined by the logic voltage level of the output of comparator 18, as aforedescribed, and is either ($K_1 \times V_{REF1}$) or ($K_2 \times V_{REF2}$). Thus, the programmable hysteresis comparator of FIG. 3 allows for independently programming the plurality of voltage levels supplied to comparator 18. In addition, with reference to FIG. 2, voltage levels 30 and 32 are respectively equal to voltages ($K_1 \times V_{REF1}$) and ($K_2 \times V_{REF2}$) and can be adjusted independently with respect to the other.

Figure 4:
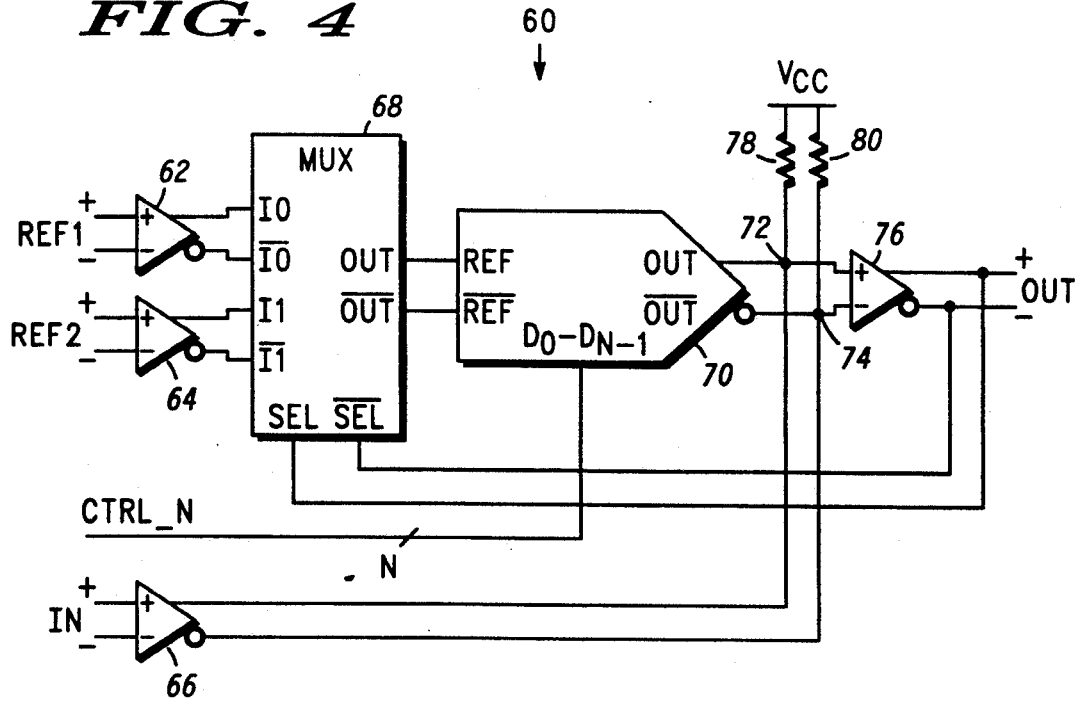
FIG. 4 is a block diagram illustrating a fully differential programmable hysteresis comparator in accordance with the present invention.

Referring to FIG. 4, a block diagram illustrating fully differential programmable hysteresis comparator 60 is shown comprising differential amplifiers 62, 64 and 66 or respectively receiving differential signals REF1, REF2 and IN.

The differential outputs of amplifiers 62 and 64 are respectively coupled to the first and second differential inputs of differential multiplexer 68. The differential output of differential multiplexer 68 is coupled to the differential reference input of differential MDAC 70.

The non-inverting output of MDAC 70 is coupled to circuit node 72, while the inverting output of MDAC 70 is coupled to circuit node 74. Likewise, the non-inverting output of amplifier 66 is coupled to circuit node 72, while the inverting output of amplifier 66 is coupled to circuit node 74.

Circuit node 72 is coupled to the non-inverting input of comparator 76, while circuit node 74 is coupled to the inverting input of comparator 76. Circuit node 72 is also coupled to operating potential $V_{CC}$ via resistor 78, while circuit node 74 is coupled to operating potential $V_{CC}$ via resistor 80.

The output of differential comparator 76 provides differential output signal OUT. Further, the differential output of comparator 76 is also coupled to the differential select input of differential multiplexer 68.

Also, differential MDAC 70 has a plurality of control inputs $D_0-D_{N-1}$ for respectively receiving a plurality of control signals denoted by CTRL_N.

Fully differential programmable hysteresis comparator 60 functions similar to programmable hysteresis comparator 10 of FIG. 1. Briefly, the signal supplied to the inverting input of comparator 76 is determined by the differential signal occurring at the output of comparator 76 and is a programmable factor of one of two predetermined signals: signal REF1 or REF2. The programmable factor is set by the logic states of the plurality of control signals supplied to differential MDAC 70.

In particular, assume that signal OUT is in a first logic state thereby passing the signal occurring at the first input of differential multiplexer 68 to the output of differential multiplexer 12. In other words, signal REF1 appears at the output of differential multiplexer 68 and, subsequently, to the reference input of differential MDAC 22.

Differential MDAC 22 subsequently provides an output signal which is substantially equal to the signal appearing at its reference input multiplied by a constant K factor. Thus, the signal applied across circuit nodes 72 and 74 is substantially equal to: (K×REF1).

As differential signal IN rises above the signal applied across circuit nodes 72 and 74 (K×REF1), the output of comparator 76 switches from a first logic state to a second logic state thereby forcing differential multiplexer 68 to pass the signal occurring at its second differential input to its output. In other words, signal REF2 appears at the output of differential multiplexer 68 and, subsequently, to the reference input of differential MDAC 70.

Likewise, differential MDAC 70 subsequently provides an output signal which is substantially equal to the signal appearing at its reference input multiplied by a constant K factor. Thus, the differential signal applied across circuit nodes 72 and 74 is now substantially equal to: (K×REF2).

Subsequently, when differential signal IN falls below the differential signal appearing across circuit nodes 72 and 74 (K×REF2), the differential output of comparator 76 switches from the second logic state back to the first logic state thereby re-setting the differential signal appearing across circuit nodes 72 and 74 back to (K×REF1) and the operation continues as aforedescribed.

By now it should be appreciated that there has been provided a novel comparator circuit having programmable hysteresis levels. Further, it should also be appreciated that there has been provided a fully differential comparator circuit with differential programmable hysteresis.

While the invention has been described in conjunction with specific embodiments thereof, it is evident that many alterations, modifications and variations will be apparent to those skilled in the art in the light of the foregoing description. Accordingly, it is intended to embrace all such alterations, modifications and variations in the appended claims.

I claim:

1. A comparator circuit having programmable hysteresis, comprising:
   a multiplexer having first, second and select inputs and an output, said first input being coupled to receive a first reference signal, and said second input being coupled to receive a second reference signal;
   a multiplier-digital-to-analog converter having a plurality of control inputs, a reference input and an output, said reference input being coupled to said output of said multiplexer, said plurality of control inputs being respectively coupled to receive a plurality of control signals for determining a gain factor of said multiplier-digital-to analog converter, said gain factor of said multiplier-digital-to-analog converter being utilized to program the level of said output of said multiplexer; and
   a comparator having first and second inputs and an output, said first input of said comparator being coupled to receive an input signal, said second input of said comparator being coupled to said output of said multiplier-digital-to-analog converter, said output of said comparator being coupled to said select input of said multiplexer and to an output of the comparator circuit.

2. A comparator circuit having programmable hysteresis, comprising:
   a first multiplier-digital-to-analog converter having a plurality of control inputs, a reference input and an output, said reference input being coupled to receive a first reference signal, said plurality of control inputs being respectively coupled to receive a first plurality of control signals for determining a gain factor of said first multiplier-digital-to analog converter;
   a second multiplier-digital-to-analog converter having a plurality of control inputs, a reference input and an output, said reference input of said second multiplier-digital-to-analog converter being coupled to receive a second reference signal, said plurality of control inputs of said second multiplier-digital-to-analog converter being respectively coupled to receive a second plurality of control signals for determining a gain factor of said second multiplier-digital-to analog converter, said gain factor of said first and second multiplier-digital-to-analog converter being utilized to respectively program the level of said first and second reference signals;
   a multiplexer having first, second and select inputs and an output, said first input of said multiplexer being coupled to said output of said first multiplier-digital-to-analog converter, and said second input of said multiplexer being coupled to said output of said second multiplier-digital-to-analog converter; and
   a comparator having first and second inputs and an output, said first input of said comparator being coupled to receive an input signal, said second input of said comparator being coupled to said output of said multiplexer, said output of said comparator being coupled to said select input of said multiplexer and to an output of the comparator circuit.

3. A fully differential comparator circuit having programmable hysteresis, comprising:
   a differential multiplexer having first, second and select inputs and an output, said first input being coupled to receive a first differential signal, and said second input being coupled to receive a second differential signal;
   a differential multiplier-digital-to-analog converter having a plurality of control inputs, a reference input and an output, said reference input being coupled to said output of said differential multiplexer, said plurality of control inputs being respectively coupled to receive a plurality of control signals for determining a gain factor of said differential multiplier-digital-to analog converter, said gain factor of said differential multiplier-digital-to-analog converter being utilized to program the level of said output of said differential multiplexer; and
   a comparator responsive to a differential input signal and a differential signal appearing at said output of said differential multiplier-digital-to-analog converter for providing a differential output signal, said differential output signal of said comparator being provided to said select input of said differential multiplexer and to a differential output of the fully differential comparator circuit.

* * * * *